United States Patent
Lundin et al.

(10) Patent No.: US 11,492,726 B2
(45) Date of Patent: Nov. 8, 2022

(54) METHOD OF FEEDING GASES INTO A REACTOR TO GROW EPITAXIAL STRUCTURES BASED ON GROUP III NITRIDE METALS AND A DEVICE FOR CARRYING OUT SAID METHOD

(71) Applicants: Vsevolod Vladimirovich Lundin, Saint-Petersburg (RU); Andrey Fedorovich Tsatsulnikov, Saint-Petersburg (RU); MONOLUM LTD, Saint-Petersburg (RU); SOFT-IMPACT LTD, Saint-Petersburg (RU)

(72) Inventors: Vsevolod Vladimirovich Lundin, Saint-Petersburg (RU); Andrey Fedorovich Tsatsulnikov, Saint-Petersburg (RU); Evgenii Evgen'evich Zavarin, Saint-Petersburg (RU); Evgenii Vladimirovich Iakovlev, Saint-Petersburg (RU); Denis Stanislavovich Bazarevskii, Saint-Petersburg (RU); Roman Aleksandrovich Talalaev, Saint-Petersburg (RU)

( * ) Notice: Subject to any disclaimer, the term of this patent is extended or adjusted under 35 U.S.C. 154(b) by 703 days.

(21) Appl. No.: 16/476,348

(22) PCT Filed: Jan. 17, 2018

(86) PCT No.: PCT/RU2018/000012
§ 371 (c)(1),
(2) Date: Jul. 8, 2019

(87) PCT Pub. No.: WO2018/143839
PCT Pub. Date: Aug. 9, 2018

(65) Prior Publication Data
US 2020/0002842 A1    Jan. 2, 2020

(30) Foreign Application Priority Data

Feb. 2, 2017  (RU) ................................ 2017103485

(51) Int. Cl.
*C30B 25/14*        (2006.01)
*C30B 29/40*        (2006.01)
(Continued)

(52) U.S. Cl.
CPC .............. *C30B 25/14* (2013.01); *B01F 23/10* (2022.01); *C30B 29/403* (2013.01);
(Continued)

(58) Field of Classification Search
CPC ......... C30B 25/14; C30B 25/16; C30B 25/20; C30B 29/403; C30B 29/38; C30B 29/40; C23C 16/52
See application file for complete search history.

(56) References Cited

U.S. PATENT DOCUMENTS

10,407,772 B2 * 9/2019  Yamada .................. C23C 16/52
2012/0052657 A1 * 3/2012 Taniyama ......... H01L 21/02576
                                                                118/724
(Continued)

*Primary Examiner* — Robert M Kunemund
(74) *Attorney, Agent, or Firm* — Vera Chernobylsky; Law Offices of Vera Chernobylsky (57) ABSTRACT

The invention relates to methods for the chemical application of coatings by the decay of gaseous compounds, in particular to methods for injecting gases into a reaction chamber. The invention also relates to means for feeding gases into a reaction chamber, said means providing for the regulation of streams of reactive gases, and ensures the possibility of obtaining multi-layer epitaxial structures having set parameters and based on nitrides of group III metals while simultaneously increasing the productivity and cost-effectiveness of the process of the epitaxial growth thereof. Before being fed into a reactor, all of the gas streams are sent to a mixing chamber connected to the reactor, and are then (Continued)

fed into the reactor via a flux former under laminar flow conditions. The mixing chamber and the flux former are equipped with means for maintaining a set temperature. As a result of these solutions, a gaseous mixture with set parameters is fed into the reactor, and the formation of vortices is simultaneously prevented. The maximum allowable volume of the mixing chamber is chosen to take into account the process parameters and the required rarity of heterojunctions.

3 Claims, 4 Drawing Sheets

(51) Int. Cl.
*H01L 21/02* (2006.01)
*B01F 23/10* (2022.01)
*H01L 29/778* (2006.01)
*B01F 25/00* (2022.01)

(52) U.S. Cl.
CPC ...... *H01L 21/0254* (2013.01); *H01L 21/0262* (2013.01); *H01L 21/02378* (2013.01); *B01F 2025/917* (2022.01); *B01F 2215/0409* (2013.01); *H01L 29/778* (2013.01)

(56) References Cited

U.S. PATENT DOCUMENTS

2014/0370689 A1* 12/2014 Pan .................. H01L 21/0254
118/725
2015/0255589 A1* 9/2015 Fenwick ........... H01L 21/0262
438/172

* cited by examiner

METHOD OF FEEDING GASES INTO A REACTOR TO GROW EPITAXIAL STRUCTURES BASED ON GROUP III NITRIDE METALS AND A DEVICE FOR CARRYING OUT SAID METHOD

FIELD OF THE INVENTION

The invention relates to chemical vapor deposition growth, in particular epitaxial layers growth. The invention also relates to feed and outlet means for gases in particular to the means for modifying the flows of reactive gases.

BACKGROUND OF THE INVENTION

To grow epitaxial structures based on group III nitrides, ammonia and metalorganic compounds in the carrier gas flow are supplied to a reactor. Reactive gases that form group III nitrides are metalorganic compounds and ammonia.

A method for supplying gases into a reactor to grow III nitride epitaxial structures on crystalline substrates is known (U.S. Pat. No. 6,972,050 "Method for depositing in particular crystalline layers, and device for carrying out the method", filed May 15, 2003, date of patent Dec. 6, 2005); the method comprising supplying into the reactor two reactive gases, each of which is mixed with a carrier gas. In the known method, a separate inlet is designed to supply each mixture with a reactive gas to a reactor, and these inlets are placed one above another between the bottom and the lid of the reactor; the inlets cross-sections are different. Group V hydrides are used as a reactive gas injected through inlet that is closer to a reactor bottom, while group III metalorganic compounds are used as a reactive gas injected through inlet closer to a reactor lid; nitrogen, hydrogen and their mixtures are used as carrier gases.

In the known method the conditions for supplying a reactive gas through the inlet closer to a reactor lid are chosen such that a gas is pyrolytically decomposed in the input zone prior reaching substrates, and the decomposition products diffuse to substrates perpendicular to the flow injected through inlet closer to a reactor bottom, where substrates are placed, and react with the products of pyrolysis of gas, which is injected through inlet closer to a reactor bottom; as a result, a crystalline layer is formed.

The necessary condition for carrying out the known method is an adjustment of kinematic viscosity of a carrier gas injected through inlet closer to a reactor lid by means of mixing two gases with different kinematic viscosities to provide the necessary ratio of Reynolds numbers for gas flows passing through insulated inlets.

The known method allows one to grow semiconductor structures—group III arsenides and phosphides. However, for the growth of multilayered epitaxial structures based on group III nitrides a use of the known method has substantial drawbacks. In particular, a wide range of ratios of reactive to carrier gases, which is necessary for a growth of different group III nitrides in the composition of multilayer epitaxial structures, does not make it possible to provide the necessary ratio of Reynolds numbers for gas flows passing through insulated inlets. Failure of this relationship leads to the occurrence of vortex flows in a reactor, which reduce the quality of grown structures, their in-plane uniformity, and negatively affects the process reproducibility. Moreover, the necessity of choosing the kinematic viscosity of a carrier gas by means of mixing two gases, the kinematic viscosities of which are substantially different, reduces the process profitability. In particular, during the growth of GaN, AlN, and AlGaN hydrogen, i.e., the lightest possible carrier gas that provide the highest diffusion coefficient of products of metalorganic compound pyrolysis, should be mixed with a gas with higher molecular mass (e.g., nitrogen). This leads to a decrease of the diffusion coefficient of products of metalorganic compound pyrolysis, which reduces the efficiency of their diffusion transport to a substrate, decreases a growth rate, and, thus, reduces the processing profitability. During the growth of InGaN layers hydrogen should not be supplied into a rector. This means that it is necessary to use expensive helium for adjusting the kinematic viscosity of a carrier gas, which also reduces the profitability of a process.

Moreover, during the growing III nitride epitaxial structures, a growth rate of epitaxial layers and, hence, the efficiency of equipment, is limited by the parasitic reactions between metalorganic compounds and ammonia in the gas phase. The known method does not allow one to prevent them Ammonia is characterized by higher diffusion coefficient than metalorganic compound vapors. Therefore, ammonia diffusion from the region of its injection into a reactor to the region of metalorganic compound injection into a reactor occurs more rapidly than the diffusion of metalorganic compounds in the opposite direction towards the region near substrates. As a result, a zone with increased concentration of mixture of metalorganic compounds with ammonia is formed in a reactor, which increases the intensity of these parasitic reactions which leads to the growth rate decrease. The effect of parasitic reactions on the growth can be effectively suppressed if the residence time of the gas mixture in a hot reactor zone is substantially decreased by a substantial increase in the gas flows injected into a reactor. However, in this case in the known method the following undesired processes occur:

firstly, at a high velocity of a gas the first condition of the known method is broken: it is no enough time to pyrolytically decompose metalorganic compounds in the inlet zone of a reactor;

secondly, at a high velocity of a gas flows through a reactor it is no time for the products of pyrolytic decomposition of metalorganic compounds to diffuse through a gas layer nearby to substrates, which mainly consists of the mixture of a carrier gas and ammonia; this decreases the growth rate in comparison with theoretically achievable value and leads to a substantial decrease in the efficiency of using expensive metalorganic compounds, a greater part of products of pyrolytic decomposition of which leaves a reactor unused. The considered undesired processes substantially reduce the profitability of the known method and equipment for using it.

An increase in the profitability of the epitaxial structure growth can be achieved by the use of the deposition method that comprises supplying metalorganic compound vapors in a reactor in the mixture with a carrier gas through inlet located near a reactor bottom, where substrates are placed. (US2007031991 Application «Method for depositing compounds on a substrate by means of metalorganic chemical vapor deposition», filed Feb. 20, 2004, published Feb. 8, 2007). As well as in the aforesaid method, the necessary ratio of Reynolds numbers for gas flows passing through insulated inlets cannot be provided, which is accompanied by the occurrence of vortex flows. The known method makes it possible to suppress the rapid formation of polycrystalline deposits on a reactor ceiling; however, the polycrystalline deposits are formed with a high rate on a reactor bottom in front of the substrates, which is also unwanted.

The method for supplying gases into a reactor to grow III nitride epitaxial structures, comprising injection of at least two reactive gases in a reactor and at least one of the gases is mixed with a carrier gas, is known (U.S. Pat. No. 8,980,000 «Density-matching alkyl push flow for vertical flow rotating disk reactors», filled Oct. 6, 2006, date of patent Mar. 17, 2015).

To grow III nitride epitaxial structures, the known method provides injection of vapors of different reactive gases that contain III group metals mixed with different carrier gases into a reactor through different inlets. In this case, the method requires that at least one of the carrier gases is obtained by means of mixing two gases with different densities. The method also requires a choice of the parameters of gas mixtures supplied into a reactor through different inlets by means of such control over flowrates of gas mixtures and composition of a carrier gas that their linear velocities and densities at the reactor entrance are equal, which allows one to avoid the formation of vortexes in a reactor and obtain high uniformity of the parameters of a deposition process.

However, to obtain multilayered epitaxial structures with given characteristics as well as in the known method considered above, there appears the necessity to use gases with wide spread of parameters in wide ranges of their quantitative ratios. As well as in the aforesaid method, for a growth of InGaN layers expensive helium should be used, while for a growth of GaN, AlN, and AlGaN to meet the method requirements with respect to the simultaneous equality of rates and densities, nitrogen or noble gas with high molecular mass should be used as a carrier gas, which reduces the efficiency of diffusion of metalorganic compound pyrolysis products to the substrates through a depleted layer and leads to a decrease in the growth rate and efficiency of using expensive metalorganic materials.

Moreover, in the known method the regions with an increased concentration of metalorganic compounds are formed in a reactor and ammonia diffusive penetration in these regions promotes the acceleration of parasitic reactions in the gas phase. To obtain multilayered epitaxial structures with given characteristics, different flows of reactive gases and strict fulfillment of the processing conditions are required to obtain different layers. The vortex flows that negatively affect the parameters of the growing layer are formed even at slight deviations from the given parameters.

A device for supplying gases in a reactor to grow III nitride epitaxial structures is known (U.S. Pat. No. 6,972, 050 «Method for depositing in particular crystalline layers, and device for carrying out the method», filled May 15, 2003, date of patent Dec. 6, 2005). The device has two inlets for injection of reactive gases into a reactor. The inlets are placed one above another between the bottom and lid of a reactor and have different cross-sections. To adjust a ratio of the cross-sections of inlets, the replaceable elements or mechanical system to change a ratio of inlet cross-sections can be designed in the device. However, in both cases it is impossible to guarantee the range of process conditions, which is necessary to obtain multilayered epitaxial structures with target characteristics, due to the insufficiently flexible and operative adjustment and impossible simultaneous fulfillment of all the given processing conditions, which is associated with that a design of the device provides the pyrolysis of metalorganic compounds prior reaching a substrate. Moreover, the presence of movable elements in the gas supply system in a reactor affects negatively the reproducibility of an epitaxial growth process because of the inevitable errors that occur during the replacement and complicates the system of gas injection into a reactor.

The device for supplying gases in a reactor to grow III nitride epitaxial structures, which contains at least two inlets for supplying reactive gases and system of gas injection into a reactor, is also known (U.S. Pat. No. 8,980,000 «Density-matching alkyl push flow for vertical flow rotating disk reactors», filled Oct. 6, 2006, date of patent Mar. 17, 2015).

In the known device the system of gas injection into a reactor contains a great number of inlets. At minimum three mass flow controllers are connected to each inlet for supplying a reactive gas: for injection of two different carrier gases with different densities and reactive gas itself. Each mass flow controller has a control error; the higher is the number of these controllers used in the device, the higher is the total error, which can increase during continuous changing parameters of the injected gas flows needed to obtain multilayered epitaxial structures, and the given structural characteristics cannot be provided.

The analysis of the considered methods and devices that effect on the characteristics of multilayered epitaxial structures based on group III nitrides has shown that the reason of these drawbacks is a separate injection of group III metalorganic compound vapors and ammonia and the necessity of complex controlling the parameters of gas flows injected into a reactor, which is accompanied by the unwanted processes, complicates the equipment, and cannot provide flexible and operative control over the process parameters.

DISCLOSURE OF THE INVENTION

The object of the invention is to provide the possibility for obtaining multilayered epitaxial structures based on group III nitrides with given parameters alongside with simultaneous increase in the production efficiency and in the profitability of the epitaxial growth process.

The problem can be solved due to that in the method for delivering gases into a reactor to grow III nitride based epitaxial structures, which comprises delivering into a reactor of at least two reactive gas bows, at least one of which is mixed with a carrier gas, the gas flows before injection into a reactor are directed to the mixing chamber connected with a reactor, the walls of which and connection zone between the chamber and reactor are preliminary heated up to 40° C. to 400° C. mixed, and then injected in a reactor in the form of a laminar flow.

It is preferable to use trimethylaluminum, trimethylindium, trimethylgallium, triethylgallium, and their mixtures as a reactive gas—a source of group III metals, and to use ammonia as a reactive gas—a source of nitrogen.

It is preferable to use hydrogen as a carrier gas.

Under certain conditions it is preferable to use a mixture of nitrogen with hydrogen with a nitrogen content not higher than 5% as a carrier gas.

In some cases, it is preferable to use nitrogen as a carrier gas.

The problem is also solved due to that in the device for supplying gases into a reactor to grow group III nitride epitaxial structures, containing at least two inlets for supplying reactive gases and system of gas injection into a reactor, the gas injection system contains at least one mixing chamber to prepare a gas mixture and flow former providing supplying gases in a rector under the conditions of a laminar flow and connecting a mixing chamber with reactor inlet; the mixing chamber and flow former are provided with tools to keep a given temperature and the internal volume of a chamber satisfies the condition:

$$V < Q \cdot (P_{st}/P) \cdot (T/T_{st}) \cdot 1 \text{ sec},$$

where V is the internal volume of a mixing chamber, $cm^3$;

Q is the total summed flow rate through a chamber, $cm^3/s$, under standard conditions;

$P_{st}/P$ is the ratio of pressure under standard conditions ($P=10^5$ Pa, T=273.15 K) to maximum pressure in a mixing chamber;

$T/T_{st}$ is the ratio of minimum temperature in a mixing chamber to temperature under standard conditions ($P=10^5$ Pa, T=273.15 K).

According to the invention before supplying into a reactor all the gas flows (reactive and carrier) are directed into a mixing chamber connected with a reactor. In this case, it is not necessary to equalize the rates and densities of gases in different inlets due to the mixing several kinds of carrier gases with different densities. In a mixing chamber, gases are mixed and then injected into a reactor under the conditions of a laminar flow. This method of supplying allows one to eliminate the main problem that occur when using all the known methods, i.e., the formation of vortexes in a reactor, which are formed during separate injection of different gases in a reactor through different inlets. In a mixing chamber, a gas mixture with common given parameters (density, flow rate, chemical composition) are formed. During follow-up injection of this mixture into a reactor, the regions with different gas density are not formed. It should be noted that this advantage is implemented at any ratio of flow rates of reactive gases and carrier gas and at any kind of a carrier gas. Thus, a possibility for injection into a reactor of a gas mixture with optimal for epitaxial growth composition is produced and there is no necessity to inject into a reactor additional flows of carrier gases with the only purpose,—to equalize the gas densities in different inlets.

Since the gas flows mixed in a mixing chamber are injected into a reactor in the form of a laminar flow, anywhere from a mixing chamber to substrates placed in a reactor the formation of vortexes, the presence of which leads to the area nonuniformity of properties of a grown structure, is eliminated. Moreover, thanks to the excluding of vortex flows, the sharpness of multilayered epitaxial structure interfaces increases since any vortex is an accumulator of reactive gases, trapping some supplied gases in its region, and slow releases them back to the main reactor volume.

In the suggested method, the walls of a mixing chamber, where all the gases are mixed and then supplied in a reactor and connection zone between the chamber and reactor, are heated before the injection of gas flows in the chamber.

This is caused by that when ammonia is mixed with metalorganic compound vapors at room temperature, the chemical reactions with the formation of adduct molecules proceed. The adducts themselves are also reactive gases; however, at room temperature due to low equilibrium pressure of the adduct vapors their condensation occurs at walls of the mixing chamber.

The heating of a mixing chamber and connection zone of a chamber with a reactor allows one to eliminate the following undesired phenomena:

ingress of reactive gases in a reactor in the amount less than it is required due to the adduct condensation, which negatively affects the properties of the grown epitaxial structure;

during the growth of multilayered epitaxial structures with given characteristics, which consist of several layers of group III nitrides with different composition, when supplying any reactive gas is stopped, a slow evaporation of the corresponding adduct occurs from walls of the chamber, where the mixing took place; this adduct is transferred by the carrier gas flow to a reactor, where the adduct acts as a source of the material, the growth of which has been already stopped; as a result, the necessary sequence of layers is broken, which leads to deterioration of the grown structure properties;

narrowing of the flow section of the mixing chamber zone and connection zone during long condensation of adducts vapors at walls.

When the temperature of mixing chamber walls and connection zone is 400° C. and higher, the synthesis of the material that is planned to be grown in a reactor on a substrate will occur on these walls, which reduces the production efficiency and processing profitability.

When temperature of mixing chamber wall is 40° C. and lower, the condensation of adducts on the mixing chamber walls starts; as a result, except the aforementioned drawbacks, an increase in the growth rate with increasing the concentration of metalorganic compounds is disproportionately low, which, on the one hand, negatively affects the production efficiency and profitability and, on the other hand, sometime does not allow to obtain given characteristics of epitaxial structure layers.

It is preferable to use trimethylaluminum, trimethylindium, trimethylgallium, triethylgallium, and their mixtures as a source of group III metals, and to use ammonia, a source of nitrogen, as a reactive gas. As has been experimentally shown, the chemical properties of these gases make it possible to avoid deposition of the products of their low-temperature reactions on the mixing chamber walls at temperature range of 40° C. to 400° C. and, thus, to prevent proceeding the unwanted high-temperature reactions in the considered temperature range. Moreover, these materials are widely used in the technique of III nitride epitaxial growth, accessible, relatively cheap in comparison with other possible reactive gases.

Nitrogen, hydrogen, or nitrogen with hydrogen mixture at any ratio required to provide proceeding the necessary chemical reactions on growing layer surface can be used.

During the growth of III nitride epitaxial structures, the mixture of reactive gases is transferred by the carrier gas flow to the heated substrates. In this case, the efficiency is affected by the epitaxial growth rate determined by the delivery rate of group III metal molecules, which depends on the diffusion coefficient of these molecules in the carrier gas. The highest diffusion coefficient can be reached when using hydrogen, a gas with the lowest molecular mass. Since the suggested method provides the mixing of injected gas mixtures in the mixing chamber and parameters of the process are unaffected by the parameters of separate gas mixtures, during the growth of GaN, AlN, and AlGaN epitaxial layers according to the suggested method it is preferable to use hydrogen as a carrier gas that guarantees the highest growth rate. The presence of small amount of another gas (e.g., nitrogen) in the composition of a carrier gas is acceptable and caused by the specific parameters of a technological process. It has been experimentally found that when the nitrogen and hydrogen mixture is used as a carrier gas, with an increase in the nitrogen content in the mixture up to 5% and higher a decrease in the growth rate is observed. Since the presence of hydrogen in a reactor is forbidden during the growth of indium-containing layers of group III nitrides (InGaN, InAlN, InGaAlN), it is preferable to use nitrogen as the cheapest gas among carrier gases that can be used.

Under some conditions during the growth of III nitride epitaxial layers, both hydrogen and nitrogen should be present in a reactor for proceeding the necessary chemical reactions on the surface of a growing layer. In this case, nitrogen-hydrogen mixture in the necessary proportional should be used. The suggested device allows one to use nitrogen-hydrogen mixtures in any ratio as a carrier gas without occurrence of unwanted vortexes in a reactor.

In the suggested device the system of gas injection into a reactor is designed in the form of no less than one mixing chamber to prepare a gas mixture and a flow former made with a possibility to supply gases into a reactor under the conditions of a laminar flow connecting a mixing chamber with a reactor inlet.

A homogeneous gas mixture is formed in the mixing chamber before injection into a reactor through a flow former; the shape and dimensions of the former provide the possibility to inject this homogenous mixture in a reactor as a laminar flow. As a result, at any ratio of mass flow rates of carrier gas and ammonia as well as at any composition of a carrier gas, the vortexes and other inhomogeneities related with a difference in the linear rates and densities of gases injected to a reactor do not occur in a reactor.

During the growth of multilayered III nitride epitaxial structures, it is necessary to provide the sharpness of interfaces between separate layers forming a multilayered epitaxial structure at the scale of 1 monoatomic layer (~0.25 nm). Otherwise, the grown structure will not be characterized by the necessary properties. When growing the different layers of group III nitrides different reactive gases should be injected into a reactor. Hence, when forming the interfaces between these layers it is necessary to change the composition of a gas mixture in a reactor, and the composition should be changed for the time that is not higher than the growth time of a single monoatomic layer since the minimum possible thickness of the transient region between different layers is determined by the equation:

$$d = V \cdot \tau,$$

where d is the minimum permissible thickness of the transient region between different layers, nm;
V is the growth rate of a crystalline layer, nm/s;
$\tau$ is the time of changing the composition of a gas mixture.

According to the suggested invention, the gases before being injected into a reactor are mixed in the mixing chamber, which, in its turn, is an additional volume that decreases the abruptness of changing the composition of a gas mixture. To obtain the necessary abrupt change in the flow compositions, the volume of a mixing chamber should satisfy the following relationship $$V < Q \cdot (P_{st}/P) \cdot (T/T_{st}) \cdot 1 \text{ sec},$$

where V is the internal volume of the chamber, $cm^3$;
Q is the total summed flow rate through the chamber, $cm^3/s$ under standard conditions;
$P_{st}/P$ is the ratio of pressure under standard conditions ($P = 10^5$ Pa, T=273.15 K) to maximum pressure in the mixing chamber, which is equal to the pressure in a reactor during of the epitaxial growth;
$T/T_{st}$ is the ratio of minimum temperature in the mixing chamber to temperature under standard conditions ($P = 10^5$ Pa, T=273.15 K).

When this relationship is satisfied, the gas volume that is higher than the volume of the mixing chamber will flow through the mixing chamber per one second. Therefore, the transient process to change the composition of a gas mixture leaving the mixing chamber will be completed by 95% for 3 s, which provides the necessary abrupt change in the composition of a mixture of reactive gases injected into a reactor. At higher volume of the mixing chamber a change in the composition of a gas mixture at output of the mixing chamber will be slower, and to obtain the necessary sharpness of the interfaces between different layers of group III nitrides, which form an epitaxial structure, it is necessary to decrease the growth rate of the structure; as a result, the time to grow the necessary structure will increase and, hence the processing profitability will be reduced.

In the suggested device, the mixing chamber and flow former are equipped by the tools to keep the given temperature that according to the suggested method is 40° C. to 400° C., which is necessary to eliminate the unwanted processes inside the mixing chamber and flow former.

BRIEF DESCRIPTION OF THE DRAWINGS

The method and device for supplying gases into a reactor to grow group III nitride epitaxial structures are illustrated by the drawings and graphs.

EMBODIMENT OF THE INVENTION

Figure 1:
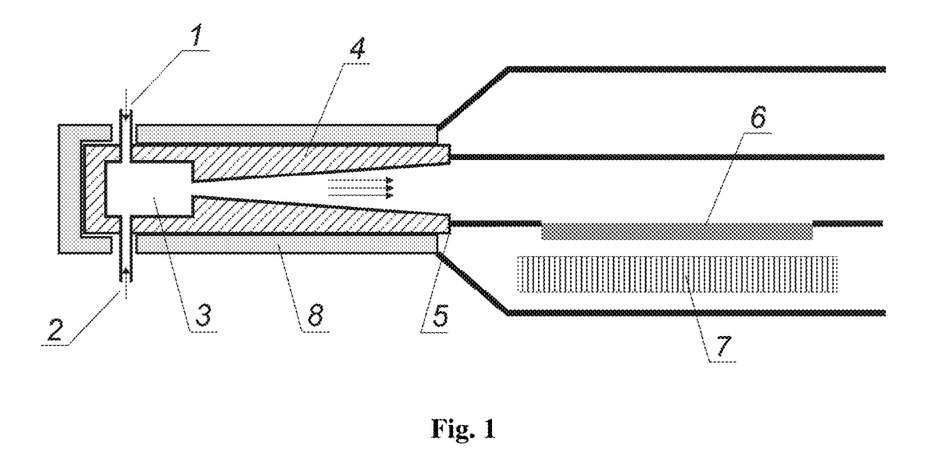
FIG. 1. System of gas injection into a reactor, side view.
Figure 2:
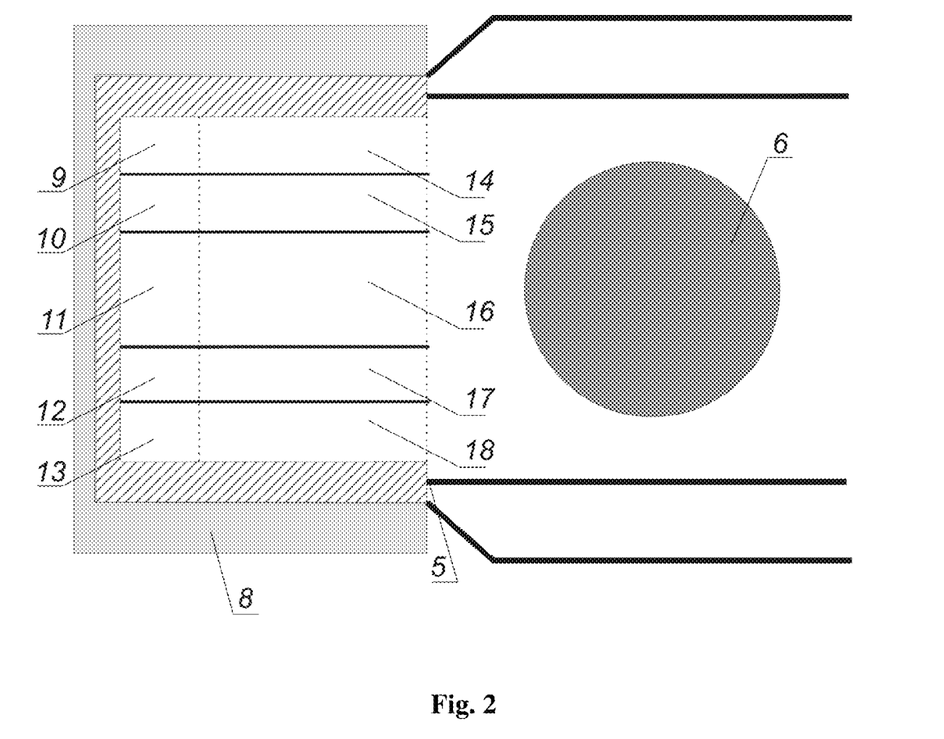
FIG. 2. System of gas injection into a reactor, top view.
Figure 3:
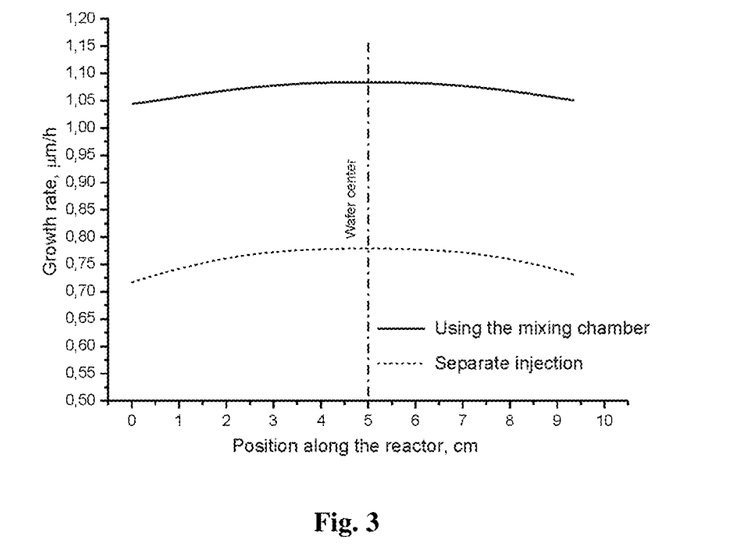
FIG. 3. Surface distribution of growth rate of AlGaN alloy across the rotating substrate in the horizontal reactor.
Figure 4:
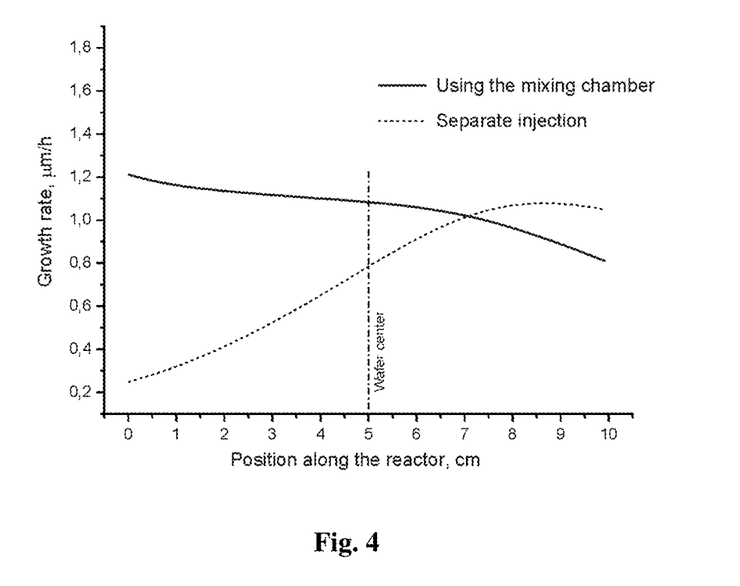
FIG. 4. Surface distribution of growth rate of AlGaN alloy across non-rotating substrate in the horizontal reactor.

The suggested device for supplying gases into a reactor to grow III nitride epitaxial structures contains at least two inlets 1 and 2 to supply reactive gases in the system of gas injection in a reactor. The system of gas injection in a reactor contains at least one mixing chamber 3 to prepare a gas mixture and flow former 4 connecting the mixing chamber with inlet in a reactor 5, where there is substrate holder 6 with no less than one substrate placed on it and substrate heater 7. The mixing chamber and flow former are equipped with the tools to keep given temperature 8. In the particular case, the system can comprise several chambers, e.g., contain five chambers 9, 10, 11, 12, and 13, each of which is connected with one of flow formers 14, 15, 16, 17, and 18 that connect the chambers with inlet in a reactor.

The suggested device can be used to grow epitaxial structures based on group III nitrides by MOVPE (MOCVD) methods in combination with reactors with different geometry, such as horizontal, planetary, and vertical.

The suggested device can be also used in combination with reactors that have several injection zones for reactive gases, through which reactive gas flows different in value are injected to compensate typical for these reactors nonuniformity of a growth rate over the substrate holder area. In this case, the suggested device should contain several mixing chambers connecting with a reactor through separate flow formers or a common flow former. During the growth of separate epitaxial layers that form a multilayered structure, exact values of reactive gas concentrations in these chambers can differ to provide the uniform growth rate over the substrate holder.

The suggested device can also be used in combination with reactors that contain additional zones for injection of purge gases (hydrogen, nitrogen, ammonia or their mixtures), the purpose of which is to suppress unwanted inhomogeneities inherent to these reactors or parasitic deposition of materials on the structural elements of a reactor.

The method and device for supplying gases into a reactor to grow III nitride epitaxial structure were tested during the epitaxial growth of $Al_xGa_{1-x}N$ alloy in the horizontal reactor with a width of 145 mm, height of 20 mm, distance from zone of gas injection in a reactor to substrate holder center of 150 mm, and with one substrate of 100 mm in a diameter. The system of gas injection into a reactor consisted of mixing chamber 3 connecting with inlet in a reactor 5 by means of flow former 4. The characteristics of reactive gas flows were chosen based on the condition for providing $x \neq 0.14$.

The characteristics of growth processes of an epitaxial layer using the mixing chamber as well as the separate inlets for injection of reactive gases into a reactor are listed in Table 1.

TABLE 1

Comparative characteristics of the growth process of $Al_{0.14}Ga_{0.86}N$ epitaxial layer when injecting reactive gases through separate inlets and using the mixing chamber to prepare a gas mixture

| Parameters of technological process | Characteristics of technological process using injection of reactive gases through separate inlets | Characteristics of technological process with a use of mixing chamber |
|---|---|---|
| Temperature of substrate holder | 1100° C. | 1100° C. |
| Pressure in reactor | 200 mbar | 200 mbar |
| Hydrogen flow | 30 SLM | 30 SLM |
| Ammonia flow | 10 SLM | 10 SLM |
| TMA flow | 25 μmol/min | 25 μmol/min |
| TMG flow | 225 μmol/min | 166 μmol/min |
| Averaged growth rate | 0.73 μm/h | 1.05 μm/h |
| AlN molar fraction in AlGaN alloy | 0.13 | 0.14 |

Based on the analysis of results given in table 1 and in FIG. 3, FIG. 4, FIG. 5, and FIG. 6, it can be concluded that a use of the suggested method and device to grow epitaxial structures makes it possible to increase the growth rate by 40% with simultaneous decrease in the trimethylgallium flow rate by 25%, which is evidence that the profitability and efficiency of the process increase. As follows from FIG. 4, when using the suggested method and device the epitaxial layer growth rate in the direction along reactor axis changes slightly but is decreases with increasing the distance from inlet in a reactor, which testifies a high level of trimethylgallium utilization. At the same time, when using the separate inlets, the trimethylgallium concentration near the substrate decreases, which leads to the substantially nonuniform growth rate along the reactor axis and the growth rate is minimum near the injector and increases with increasing the distance from it. The latter means that considerable amount of trimethylgallium is not used during the synthesis of an epitaxial layer and leaves a reactor being unutilized, which results in the low profitability of the process.

Figure 5:
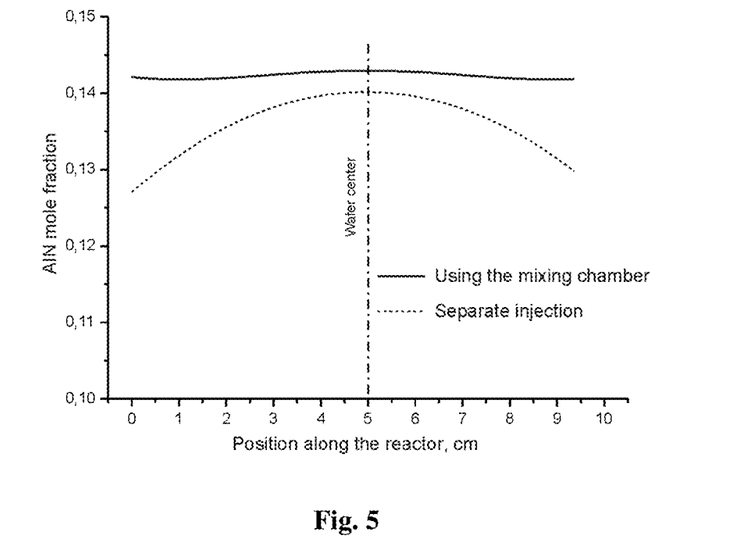
FIG. 5. Surface distribution of composition of AlGaN alloy across the rotating substrate in the horizontal reactor.
Figure 6:
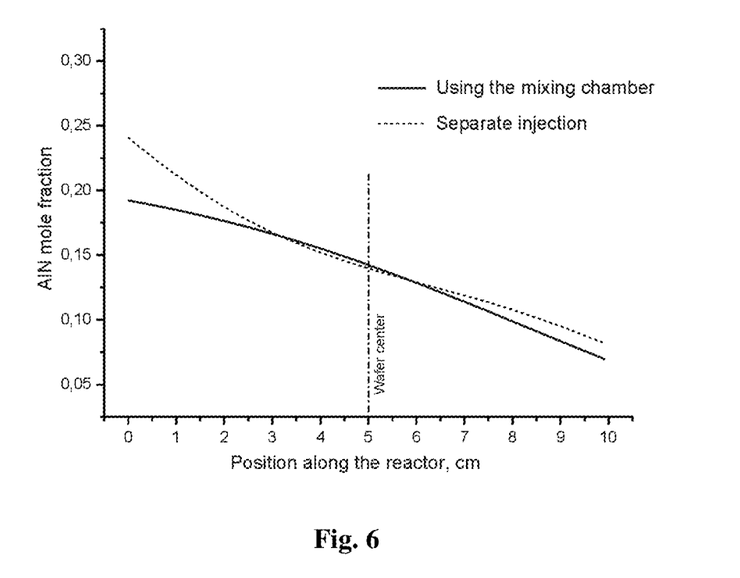
FIG. 6. Surface distribution of composition of AlGaN s alloy across over the non-rotating substrate in the horizontal reactor.

As follows from FIG. 5 and FIG. 6, when using the suggested method and device high uniformity of AlN molar fraction in the AlGaN epitaxial layer over the substrate area is reached.

Using the same reactor, the suggested method and device were tested during the growth of the III nitride multilayered epitaxial structure of high electron mobility transistor on the silicon carbide substrate with a diameter of 100 mm The composition of the transistor structure in sequence starting from the substrate:

1. $Al_{0.35}Ga_{0.65}N$ buffer layer with a thickness of 0.2 μm;
2. GaN buffer layer with a thickness of 2.4 μm;
3. GaN channel layer with a thickness of 0.4 μm;
4. AlN barrier layer with a thickness of 0.75 nm;
5. $Al_{0.25}Ga_{0.75}N$ barrier layer with a thickness of 21 nm.

To supply gases into a reactor, the gas injection system that comprises mixing chamber 3 to prepare a gas mixture and flow former 4 connecting the mixing chamber with inlet and providing gas injection into a reactor as a laminar flow was used. The mixing chamber and flow former were heated up to a temperature of 150° C. using heater 8.

During the growth of multilayered epitaxial structures, it is necessary to change abruptly the chemical composition of an injected mixture of carrier gas and reactive gases with the aim to provide the sharpness of interfaces between separate layers that form a multilayered structure at the scale of an atomic layer (~0.25 nm). At actual growth rates this means that for all the growth conditions used in the technological process of epitaxial structure growth the following condition should be satisfied $V < Q \cdot (Pst/P) \cdot (T/Tst) \cdot 1$ sec, where V is the internal volume of a mixing chamber, cm³;

Q is the total summed flow rate through a chamber cm³/s, under standard conditions;

$P_{st}/P$ is the ratio of pressure under standard conditions to maximum pressure in a mixing chamber;

$T/T_{st}$ is the ratio of minimum temperature in a mixing chamber to temperature under standard conditions.

When this condition is satisfied, in 5 s after changing the chemical composition of gases injected in the mixing chamber the composition of a gas mixture at output of the mixing chamber will change by more than 99%, which can be regarded as a total composition change.

The volume of mixing chamber 3 was 60 cm³. The values of $Q \cdot (Pst/P) \cdot (T/Tst) \cdot 1$ sec when growing all 5 layers forming the transistor structure are listed in Table 2. Based on the data given in Table 2 it can be concluded that the condition is satisfied for all the layers.

TABLE 2

Process parameters vs. volume of the mixing chamber.

| Layer | Q, cm3/s under standard conditions | Pst/P | T/Tst | Q•(Pst/P)•(T/Tst)•1 sec |
|---|---|---|---|---|
| 1 | 583 | 10 | 1.55 | 9035 |
| 2 | 218 | 2.5 | 1.55 | 845 |
| 3 | 358 | 1.25 | 1.55 | 693 |
| 4 | 583 | 5 | 1.55 | 4518 |
| 5 | 583 | 5 | 1.55 | 4518 |

The conditions and results of the carried out experiment are given in Table 3.

TABLE 3

Characteristics of the growth process of layers that form a III nitride epitaxial structure of a high electron mobility transistor on the silicon carbide substrate of 100 mm in a diameter.

| Layer | T, °C. | P, mbar | $H_2$, slm | $N_2$, slm | $NH_3$, slm | TMGa, μmol/min | TMAl, μmol/min | Growth rate, μm/h | Duration of growth, min | Thickness, μm |
|---|---|---|---|---|---|---|---|---|---|---|
| 1 | 1080 | 100 | 30 | 0 | 5 | 90 | 50 | 1.5 | 8 | 0.2 |
| 2 | 1060 | 400 | 8.4 | 0 | 4.66 | 500 | 0 | 8 | 18 | 2.4 |
| 3 | 1060 | 800 | 13.8 | 0 | 7.66 | 600 | 0 | 6 | 4 | 0.4 |
| 4 | 1010 | 200 | 6 | 24 | 5 | 0 | 16 | 0.065 | 0.66 | $7.5 \cdot 10^{-4}$ |
| 5 | 1010 | 200 | 6 | 24 | 5 | 36 | 16 | 0.26 | 4.87 | 0.021 |
| Total | | | | | | | | | 35.5 | ~3 |

The duration of the technological process (except of reactor heating and cooling, the duration of which is unaffected by the method of supplying gases into a reactor) was 35.5 min. This is several times less than when using the known methods and equipment, which confirms the high production efficiency of the suggested method and device for carrying out the method.

Based on the analysis of data given in Table 3, one can conclude that the epitaxial structure growth process can successfully proceed over a wide range of pressures (100-800 mbar) at substantially different total flow rates of gases passing through a reactor (13-35 slm). It can be also noted that the process proceeds effectively both when using only hydrogen as a carrier gas (layers 1-3) and when using nitrogen and hydrogen mixture with prevalence of nitrogen (layers 4 and 5, for which the presence of nitrogen in a reactor is necessary because of the peculiarities of surface chemical reactions).

Figure 7:
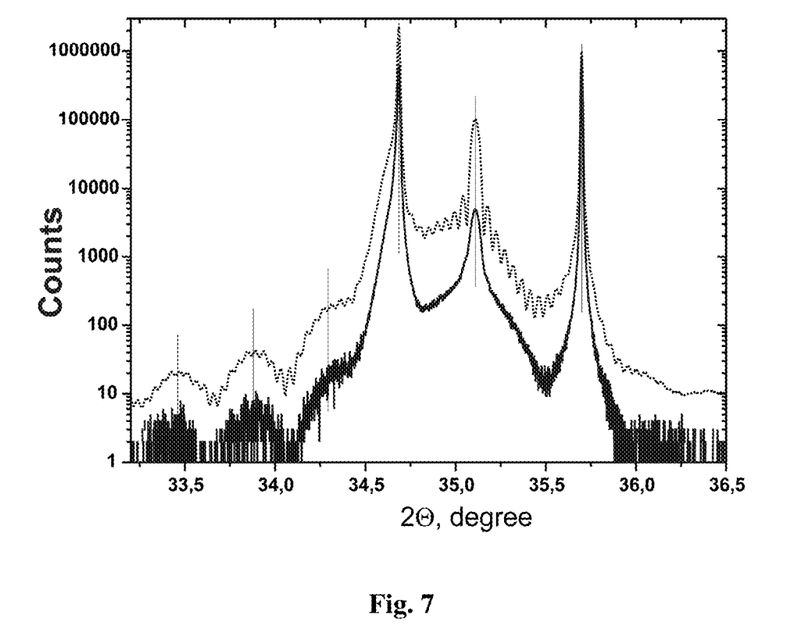
FIG. 7. X-ray diffraction curve of III nitride epitaxial structure on the silicon carbide substrate.

The thickness and composition of epitaxial layers of the structure were determined based on the results of high-resolution X-ray diffractometry. The X-ray diffraction curve for the obtained epitaxial structure is shown in FIG. 7. A good agreement of maximum positions and shape of the experimental curve (solid line) with maximum positions and shape of the calculated curve (dashed line, for visual clarity shifted up along vertical axis) has shown that the obtained layer parameters of the grown structure, in particular, the thickness and chemical composition of separate epitaxial layers, almost coincide with the calculated results.

Figure 8:
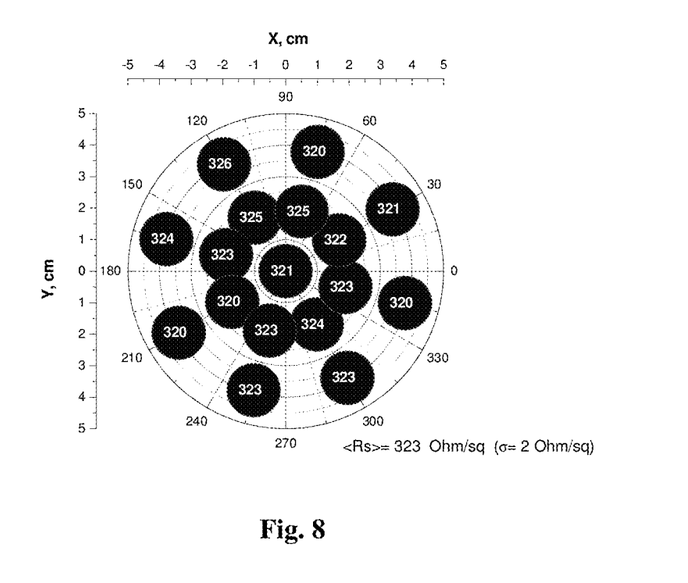
FIG. 8. Distribution map of resistance of a conducting channel of III nitride epitaxial structure over the substrate with a diameter of 100 mm.

The high uniformity of obtained structure over the substrate was confirmed by means of resistivity mapping. The resistivity map of the epitaxial structure over the substrate with a diameter of 100 mm is shown in FIG. 8. The extremely low value of nonuniformity (2 Ω/square) in comparison with a mean value (323 Ω/square) corresponds to the magnitude of relative nonuniformity of 0.6%, which corroborates that the suggested method and device can provide a growth of area-uniform multilayered epitaxial structures.

The invention claimed is:

1. A method of delivering gas into a rector for epitaxial growth of group III nitrides, comprising delivering into a reactor of at least two reactive gas flows, at least one of which is mixed with a carrier gas, using trimethylaluminum, trimethylindium, trimethylgallium, triethylgallium, and their mixtures as a reactive gas—a source of group III metals, and using ammonia as a reactive gas—a source of nitrogen, wherein the gas flows before injection into a reactor are directed to at least one connected with a reactor mixing chamber for formation of gas mixture, and then gas mixture is delivered into a reactor via flow former shaped for laminar flow conditions promotion, and the walls of mixing chamber and flow former are heated and kept at temperature of 40° C. to 400° C., and the internal volume of the mixing chamber fulfills the conditions:

$V < Q \cdot (P_{st}/P) \cdot (T/T_{st}) \cdot 1$ sec, where

V is the internal volume of a mixing chamber, cm³;
Q is the total summed flow rate through a chamber, cm³/s under standard conditions;
$P_{st}$, $T_{st}$ are standard values of pressure and temperature (P=10⁵ Pa, T=273.15 K);
P is a pressure in the mixing chamber;
T is a minimal temperature in the mixing chamber.

2. The method of claim 1, wherein hydrogen or hydrogen-nitrogen mixture with nitrogen content no more than 5% is used as a carrier gas.

3. The method of claim 1, wherein nitrogen is used as a carrier gas.

* * * * *